United States Patent
Klimes et al.

(10) Patent No.: US 6,274,492 B1
(45) Date of Patent: Aug. 14, 2001

(54) PROCESS AND DEVICE FOR PRODUCTION OF METALLIC COATINGS ON SEMICONDUCTOR STRUCTURES

(75) Inventors: Wolfgang Klimes; Christian Wenzel; Norbert Urbansky; Peter Siemroth; Thomas Shuelke; Bernd Schultrich, all of Dresden (DE)

(73) Assignees: Technische Universitaet Dresden, Dresden (DE); Fraunhofer-Gesellschaft zur Foerderung der Angewandten Forschnung E.V., Munich (DE)

( * ) Notice: Subject to any disclaimer, the term of this patent is extended or adjusted under 35 U.S.C. 154(b) by 0 days.

(21) Appl. No.: 09/194,370
(22) PCT Filed: May 30, 1997
(86) PCT No.: PCT/DE97/01081
§ 371 Date: Mar. 1, 1999
§ 102(e) Date: Mar. 1, 1999
(87) PCT Pub. No.: WO97/46728
PCT Pub. Date: Dec. 11, 1997

(30) Foreign Application Priority Data

May 31, 1996 (DE) .............................. 196 21 855

(51) Int. Cl.⁷ .................................................. H01L 21/314
(52) U.S. Cl. .......................... 438/675; 438/676; 438/679; 438/761; 438/763
(58) Field of Search .................................... 438/694, 690, 438/691, 692, 693, 643, 626, 761, 675, 763, 676, 679; 216/17, 18; 257/774, 750, 763, 764, 770, 773

(56) References Cited

U.S. PATENT DOCUMENTS 4,900,695   2/1990   Takahashi et al. .
4,962,054 * 10/1990   Shikata ................................... 437/40

(List continued on next page.)

FOREIGN PATENT DOCUMENTS 0275018   7/1988   (EP) .

Primary Examiner—Mary Wilczewski
Assistant Examiner—David Goodwin
(74) Attorney, Agent, or Firm—Jordan and Hamburg LLP

(57) ABSTRACT

The invention relates to a process and a device for metallization of semiconductor structures, with which areas of the surface can be connected to be electrically conductive using strip conductors in one or a plurality of planes, and contacts between the strip conductors of different planes. The process for producing metallic coatings on semiconductor structures by depositing from a vapor phase under vacuum, in trenches produced for the strip conductors and holes for strip conductor connection in the substrate material such as $SiO_2$ or other inorganic and organic materials is characterized in that a known per se pulsed vacuum-arc evaporator is used, a barrier layer being deposited on the surface of the trenches and holes of the substrates using the plasma of the evaporator and/or the trenches and holes being filled with low-impedance strip conductor material from a further plasma of said type of evaporator. The invention describes a device for carrying out the process which can be used, along with the device, to metal-coat trenches and holes with a high aspect ratio without hollow spaces.

22 Claims, 8 Drawing Sheets

U.S. PATENT DOCUMENTS

Figure 1:
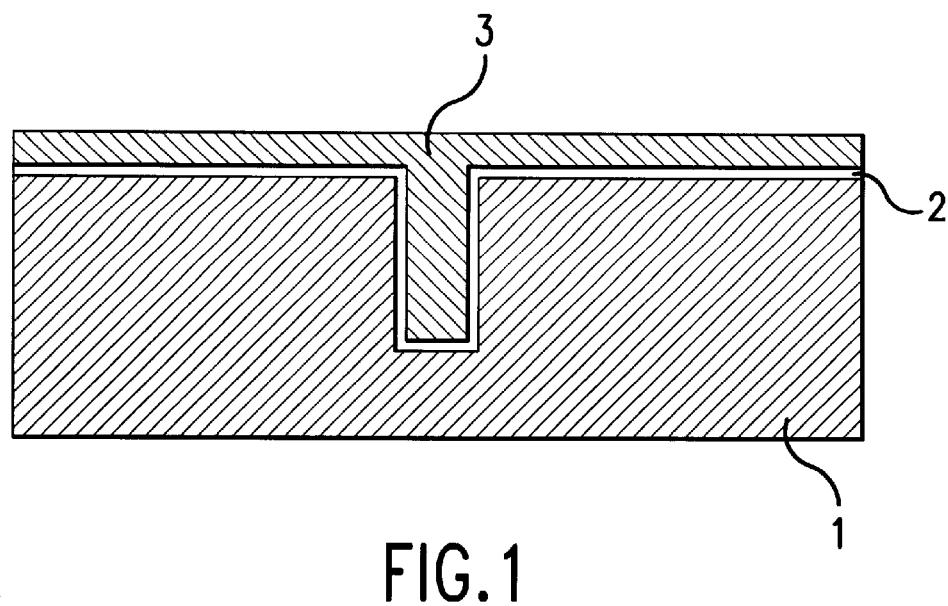

| | | |
|---|---|---|
| 5,013,578 | 5/1991 | Brown et al. . |
| 5,108,951 | 4/1992 | Chen et al. . |
| 5,114,556 * | 5/1992 | Lamont .................... 204/192.12 |
| 5,122,251 * | 6/1992 | Campbell et al. ........... 204/298.06 |
| 5,221,349 * | 6/1993 | Tamagaki ........................ 118/708 |
| 5,302,266 | 4/1994 | Grabarz et al. . |
| 5,401,543 | 3/1995 | O'Neill et al. . |
| 5,401,675 | 3/1995 | Lee et al. . |
| 5,476,691 * | 12/1995 | Komvopoulos ................ 427/527 |
| 5,502,004 | 3/1996 | Park . |
| 5,521,114 * | 5/1996 | Rajeevakumar ................... 437/60 |
| 5,529,670 * | 6/1996 | Ryan et al. ................... 204/192.15 |
| 5,580,429 * | 12/1996 | Chan ............................. 204/192.38 |
| 5,840,163 * | 11/1998 | Welty ............................ 204/192.38 |
| 5,841,236 * | 11/1998 | Brown ............................ 315/111.41 |
| 5,851,475 * | 12/1998 | Komvopoulos ................... 264/430 |
| 5,960,320 * | 6/1999 | Park .................................. 438/688 |
| 5,962,923 * | 10/1999 | Xu et al. .............................. 257/774 |
| 6,022,808 * | 2/2000 | Nogami ............................. 438/694 |
| 6,051,114 * | 4/2000 | Yao et al. ........................ 204/192.3 |

* cited by examiner

PROCESS AND DEVICE FOR PRODUCTION OF METALLIC COATINGS ON SEMICONDUCTOR STRUCTURES

The invention relates to a process and a device for the metallisation of semiconductor structures by which regions of the surface can be electrically connected by means of strip conductors in one or several planes and contacts between the strip conductors of different planes. With the increasing density and complexity on the chip the requirements of the metal coating process continuously grow. Ever-increasing numbers of strip conductors on the different planes and contacts between the strip conductors have to be realized. Strip conductors of ever-decreasing widths and contact areas are used. The structural fineness following for the metallisation of the VLSI components demands specially adapted processes.

In some processes the material of the strip conductors is coated on the whole surface of the plane substrates. Structuring is by back etching and use of masks. In other processes the strip conductor and contact material is coated on substrates whose surface has previously been provided with the trenches and holes necessary for strip conductors and contacts. A subsequent, for example, CMP process removes the undesired conducting material outside of the trenches and holes. In this process the conforming deposition of an adhesion and barrier coating on the surface of the trenches and holes and subsequent filling of the trenches and holes is particularly difficult. This is due to the continuously decreasing structural widths connected with simultaneously increasing aspect ratios. Some processes use CVD processes. U.S. Pat. No. 4,900,695, for example, uses physically supported CVD processes. In general, the technological realization of CVD processes is expensive and process conduction is not without its problems in terms of environment protection. In U.S. Pat. No. 5,108,951, metallisation is carried out at higher temperatures and smaller deposition rates thus utilizing the higher mobility of the atoms of the coating material to completely fill the trenches and holes. This method, however, is unfavourable due to its low efficiency and limitation to small aspect ratios. DE 3925603 describes the production of narrow strip conductors on a relatively plane substrate by anisotropic etching of the conductive material deposited on the whole surface at a previously generated stop. A drawback is the necessity to perform a second process step, anisotropic etching. According to U.S. Pat. No. 5,401,675 a barrier for large aspect ratios is created by sputtering using a collimator. It is a disadvantage of this method that the inhomogeneity and inefficiency increase with increasing aspect ratio. The latter is particularly true for filling up with conductive material. Also known is the application of post-ionisation of the sputtered metal atoms in a plasma produced by a high-frequency field, with inductive coupling of the high-frequency field (S. M. Rossnagel and J. Hopwood, Journ. Vac. Sci. Technol. B 12 (1), January/February 1994, pp. 449–453). According to U.S. Pat. No. 5,302,266, post-ionisation of metal atoms by ECR plasmas make possible the filling of structures with large aspect ratios. These methods appear to require great effort in apparatus. Differing from the above PVD processes, according to G. A. Dixit, W. Y. Hamamoto, M. K. Jain, L. M. Ting, R. H. Havemaim, C. D. Dobson, A. I. Jeffryes, P. J. Holverson, P. Rich, D. C. Butler and J. Hems, SEMICONDUCTOR INTERNATIONAL; August 1995, pp. 79–85 the formation of cavities during filling of structures with large aspect ratios using conventional sputter coating is accepted. At a subsequent process step the cavities in the interior are eliminated using a high-pressurised inert gas and high temperature acting on the closed surface of the coated semiconductor structure. A drawback is the necessity of two process steps demanding highly different technological equipment.

It is the objective of the invention to fill the trenches and holes generated on previously structured planar microelectronic substrates in order to connect regions of the surface in one or several planes. The above disadvantages of known processes and devices are to be eliminated.

According to the invention, the problem is solved using a process given by claim 1. Claim 2 presents an advantageous variation of the process. Further, the problem is solved by a device with the features of claim 3. The subclaims present other useful developments of the invention.

It was found that, surprisingly, a barrier and/or low-impedance strip conductor material can be deposited from the vapour phase of a known per se pulsed vacuum arc evaporator in trenches produced for the strip conductors and holes for strip conductor connections in the substrate material such as, for example, $SiO_2$ or other inorganic or organic materials.

The high degree of ionisation and the high particle energy allow both the necessarily conforming coating with barrier material and subsequent filling with conductive material of the trenches and holes for large aspect ratios. The barrier layers are characterised by a low defect density. Other features of the invention for the formation of a barrier layer are the inflow of inert gases such as argon, and/or reactive gases such as nitrogen, into the recipient so that a largely conforming deposition and the desired composition of the layer are achieved. The arrangement of the substrate surface normal, parallel or inclined to the propagation direction of the plasma leads to a highly differing deposition results inside and outside of the structure. Conforming deposition can be promoted for parallel or inclined arrangement by rotating the substrates.

Another possibility to produce barriers is the arrangement of an aperture between substrate and pulsed vacuum arc evaporator. Apart from good conformity droplet-free deposition is achieved. Biasing the substrate, or substrate and aperture, respectively, effectively enhances the deposition conditions for the barrier and strip conductor materials.

A coil that produces a magnetic field axial to the pulsed vacuum arc evaporator enlarges, in connection with a biased inner surface of the coil, the efficiency and lowers the droplet proportion on the substrate. Simultaneously the conditions for filling up trenches and holes with large aspect ratios are improved.

Another possibility to lower the droplet proportion is a pulsed vacuum arc evaporator and a coil for the adjustment of the plasma characteristics to a subsequent torus coil the inner surface of which is biased. Another coil enables the torus exit to be adjusted to the substrate with structures of a large aspect ratio.

For extremely high aspect ratios, the metallisation is carried out at higher substrate temperatures typical to the material or a subsequent second step eliminates or reduces, respectively, the isolated cavities by high inert gas pressures applied onto the substrate surface, combined with appropriate high temperatures.

The advantage of the solution according to the invention is that largely droplet-free, dense, metallic coatings can be deposited on microstructured substrates with large aspect ratios. Dependent upon the process conduction the complete filling up of trenches with an aspect ratio >1 as well as the contour-conforming deposition of barrier coatings is possible.

In the following, further details of the invention will be disclosed by the description of several examples of embodiment. By means of the accompanying drawing it is shown by FIG. 1 the enlarged cross-section of a trench in the substrate, FIG. 2 a device according to the invention to carry out the process, FIG. 3 a device according to the invention with two substrates, FIG. 4 a device according to the invention with the substrate arranged parallel to the central axis of the evaporator, FIG. 5 a device according to the invention with an aperture between evaporator and substrate, FIG. 6 a representation showing the production of the barrier layer and the production of the metal coating in the trenches and holes, FIG. 7 a device according to the invention with a coil between evaporator and substrate, FIG. 8 a device according to the invention with a curved coil between evaporator and substrate.

EXAMPLE OF EMBODIMENT 1

Figure 2:
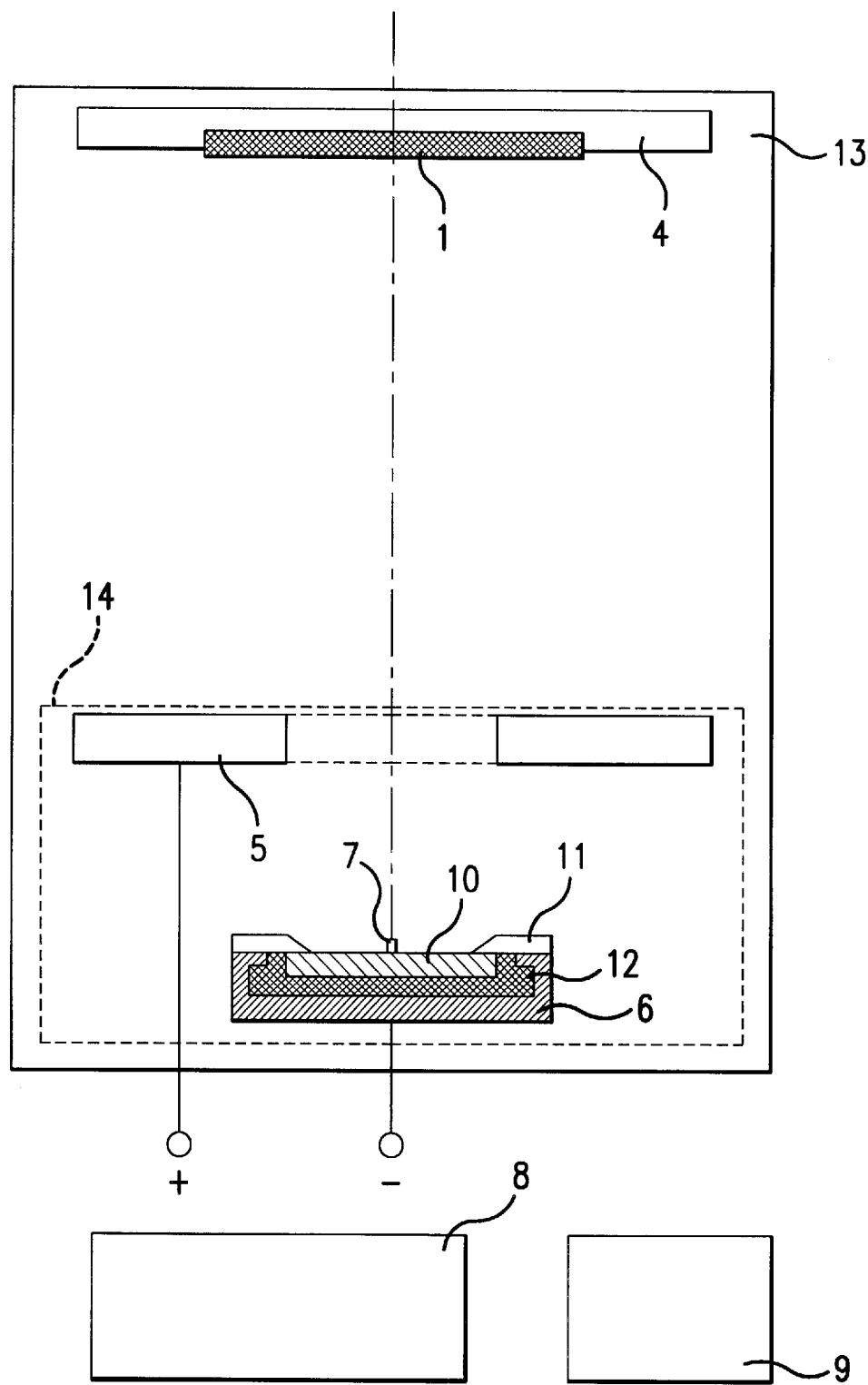

FIG. 1 shows a highly enlarged cross-section of a trench in a substrate 1. After in a previous process, a diffusion barrier 2 has been applied a copper coating 3 that fills the trenches completely up is intended to be applied using the device according to the invention. The aspect ratio of these trenches is greater than one. The device and the process are explained by means of FIG. 2. For metal coating one substrate 1 each is introduced into the vacuum chamber 13 by the usual specimen manipulators and positioned opposite to the pulsed vacuum arc evaporator 14 functioning as the evaporator in the coating position on the substrate support 4 which is stabilised at 200° C. The pulsed vacuum arc evaporator 14 consists of the anode 5, cathode 6, ignitor 7 arranged in the centre of the cathode, pulsed current source 8 outside of the vacuum recipient, and process control electronics 9. The active zone 10 of the cathode 6 (the so-called target 10) is made of copper and can be replaced periodically after the treatment of several hundreds of substrates. The actual target 10—a circular copper disk—is pressed onto the cooled cathode body using a clamping device 11 to ensure low-loss current transfer and good heat dissipation. Several targets 10 with the corresponding ignitors 7 are mounted after each other in a target slide 12 that can be moved if required (in FIG. 2 normal to the plane of the drawing). The distance between the evaporator 14 and substrate 1 is at least four times the substrate diameter, in the case in hand, 100 cm. During coating the substrate 1 is arranged such that the normal passing its centre is exactly adjusted to the centre of the evaporator 14. After the substrate 1 has been located in the coating position by the specimen manipulators, the evaporator 14 is set into operation. In order to fill the 1 μm deep trenches and holes, 25,000 discharges of the evaporator 14 are released which takes, for a pulse frequency of 50 Hz, approx. 8 min and 20 sec. Then the substrate is removed from the substrate support by the specimen manipulating device and moved to the next process chamber where undesired coatings are removed by conventional chemical-mechanical polishing.

EXAMPLE OF EMBODIMENT 2

Figure 3:
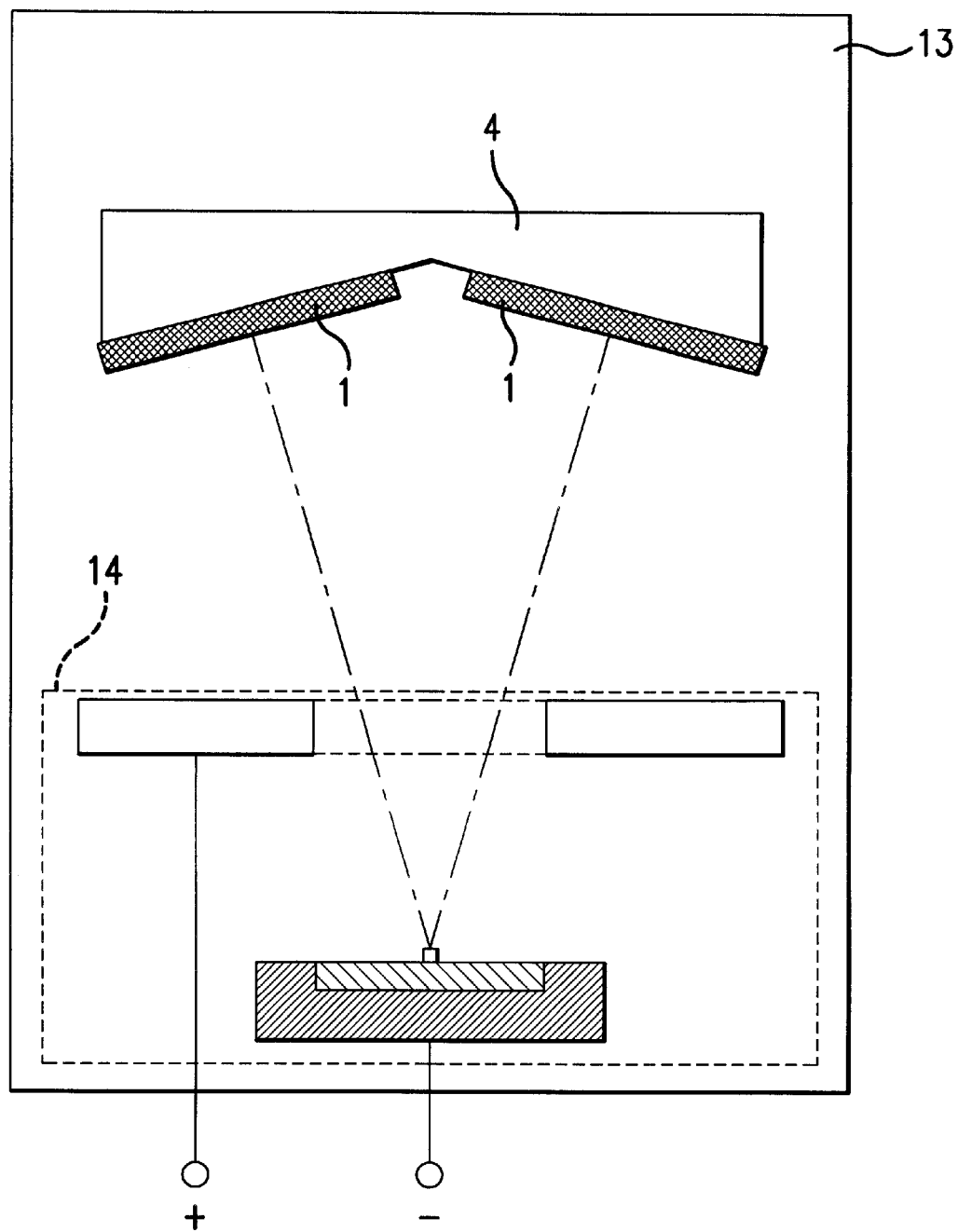

As in the example of embodiment 1, trenches or holes, respectively, on previously structured planar, microelectronic substrates coated with a barrier layer, with a diameter of 20 cm minimum are to be filled to connect components of different planes. In the example of embodiment 2, however, several substrates 1 are to be treated simultaneously. The device according to the invention is shown in the diagram of FIG. 3. For metal coating the substrates 1 are introduced into the vacuum chamber 13 by the usual specimen manipulators and positioned opposite to the evaporator 14 in the coating positions on the substrate supports 4 which are stabilised at 200° C. The pulsed vacuum arc evaporator 14 is identical with that one described in example 1. The distance between the evaporator 14 and substrates 1 also here is at least four times the substrate diameter that is, in the case in hand, 100 cm. During coating the substrates 1 are arranged such that the central axes of each of the substrates 1 are adjusted to the centre of the evaporator 14. After the substrates 1 have been located in the coating positions by the specimen manipulators, the evaporator 14 is set into operation. In order to fill the 1 μm deep trenches and holes, 35,000 discharges of the evaporator 14 are released. This process takes for a pulse frequency of 50 hz, 11 min and 40 sec.

EXAMPLE OF EMBODIMENT 3

Figure 4:
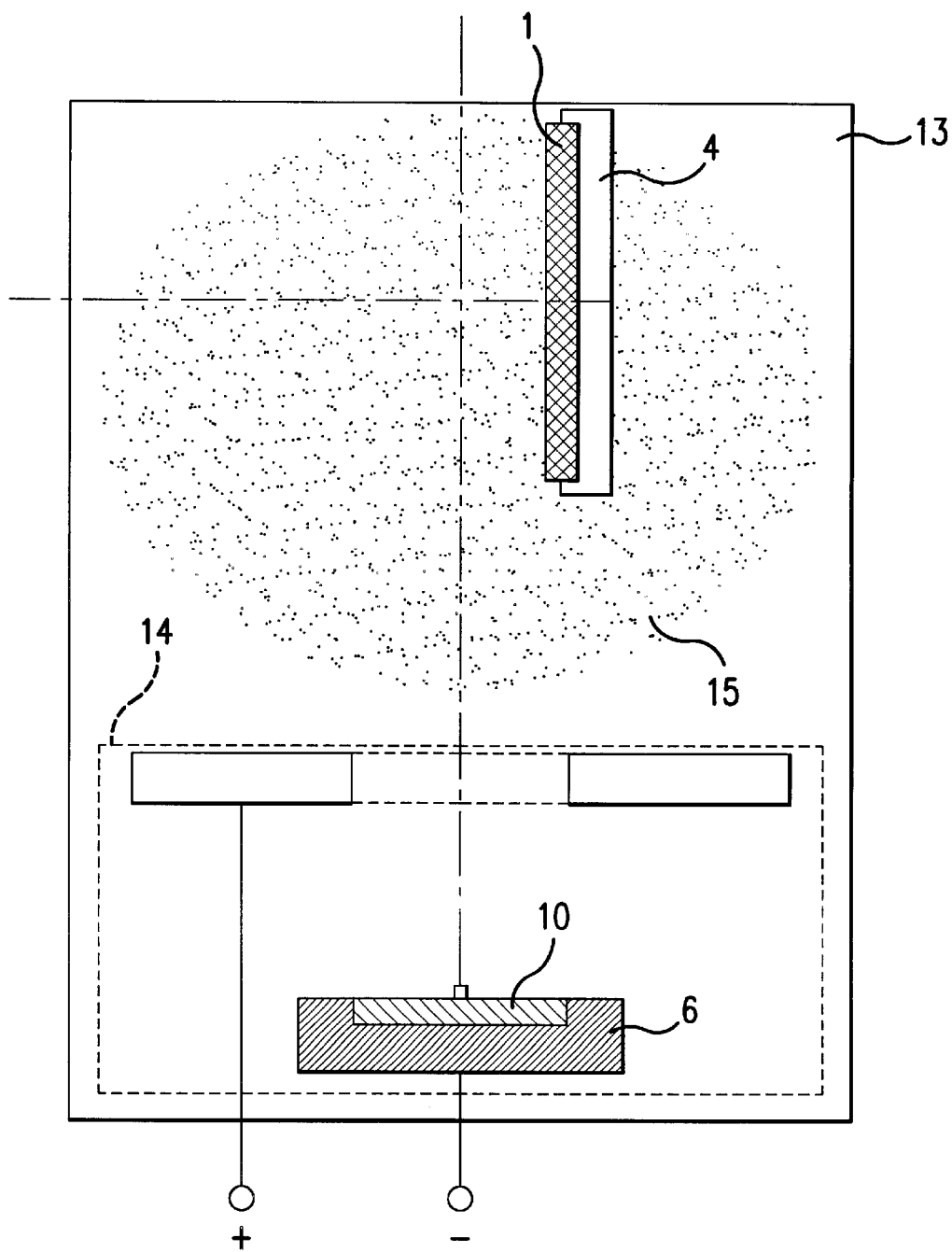

In the example of embodiment 3 thin, conforming barrier coatings are deposited on the walls of trenches or holes, respectively, on previously structured planar, microelectronic substrates with diameters of 20 cm minimum and these indentations are then filled up in a subsequent operation (as described in the examples of embodiment 1 or 2). The aspect ratio of these indentations is greater than one. The device according to the invention is shown in the diagram of FIG. 4. For treatment one substrate 1 each is introduced into the vacuum chamber 13 by the usual specimen manipulators and positioned opposite to the evaporator 14 parallel with the central axis of the evaporator in the coating position on the substrate support 4. The pulsed vacuum arc evaporator 14 is identical with that one described in example 1. The active zone 10 of the cathode 6 (the so-called target 10) is made of tantalum and can be replaced periodically after the treatment of several hundreds of substrates. For coating a gas mixture of argon and nitrogen is let into the vacuum chamber 13 until the operating pressure of 0.5 Pa has been reached. The distance between the evaporator 14 and substrate 1 is, in this case, 50 cm. After the substrate 1 has been located in the coating position by the specimen manipulators, the evaporator 14 is set into operation. In order to coat the side and bottom walls of the 1 μm deep trenches and holes with a 50 nm thick barrier coating of TaN, 12,500 discharges of the evaporator are released which takes for a pulse frequency of 50 Hz, 4 min and 10 sec. Then the substrate is removed from the substrate support by the specimen manipulating device and moved to the next process chamber.

EXAMPLE OF EMBODIMENT 4

Figure 5:
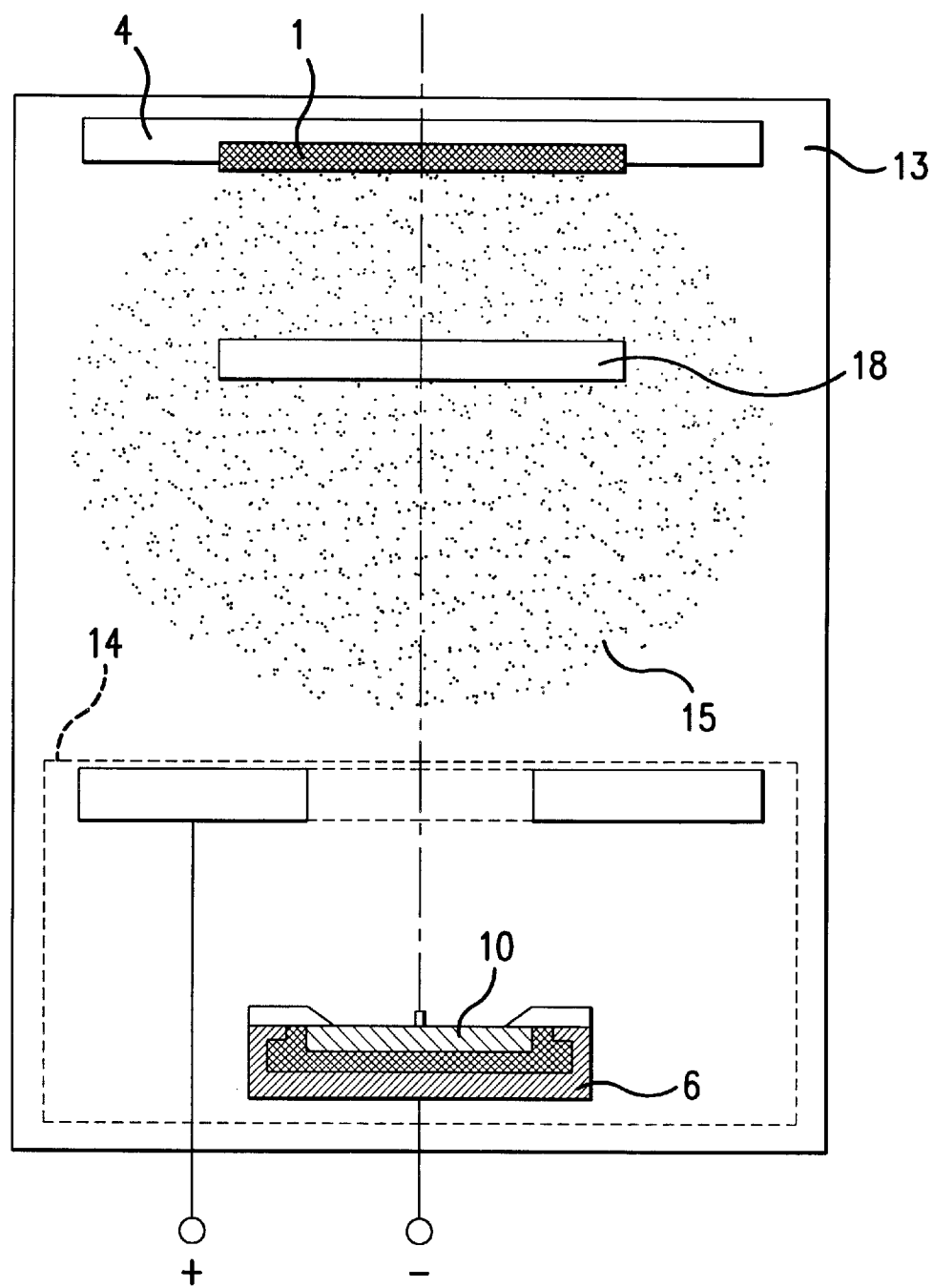

In the example of embodiment 4 thin, conforming barrier coatings are deposited on the walls of trenches or holes, respectively, on previously structured planar, microelectronic substrates with diameters of 20 cm minimum with these indentations to be then filled up in a subsequent operation (as described in the examples of embodiment 1 or 2). The aspect ratio of these indentations is greater than one. The device according to the invention is shown in the diagram of FIG. 5. For treatment one substrate 1 each is introduced into the vacuum chamber 13 by the usual specimen manipulators and positioned opposite to the evaporator 14 parallel with the central axis of the evaporator in the coating position on the substrate support 4. An aperture biased to the cathode is arranged between the evaporator 14 and substrate support 4 such that the whole substrate surface is covered opposite to the evaporator 14. The pulsed vacuum are evaporator 14 is identical with that one described in example 1. The active zone 10 of the cathode 6 (the so-called target 10) is made of tantalum and can be replaced periodically after the treatment of several hundreds of substrates. For coating a gas mixture of argon and nitrogen is let into the vacuum chamber 13 until the operating pressure of 0.5 Pa has been reached. The distance between the evaporator 14 and aperture 18, and the aperture 18 and substrate 1 is, in this case, 50 cm each. After the substrate 1 has been located in the coating position by the specimen manipulators, the evaporator 14 is set into operation. In order to coat the side and bottom walls of the 1 $\mu$m deep trenches and holes with a 50 nm thick barrier coating of TaN, 62,500 discharges of the evaporator are released which takes for a pulse frequency of 200 Hz, 5 min and 12 sec. Then the substrate is removed from the substrate support by the specimen manipulating device and moved to the next process chamber.

EXAMPLE OF EMBODIMENT 5

Figure 6:
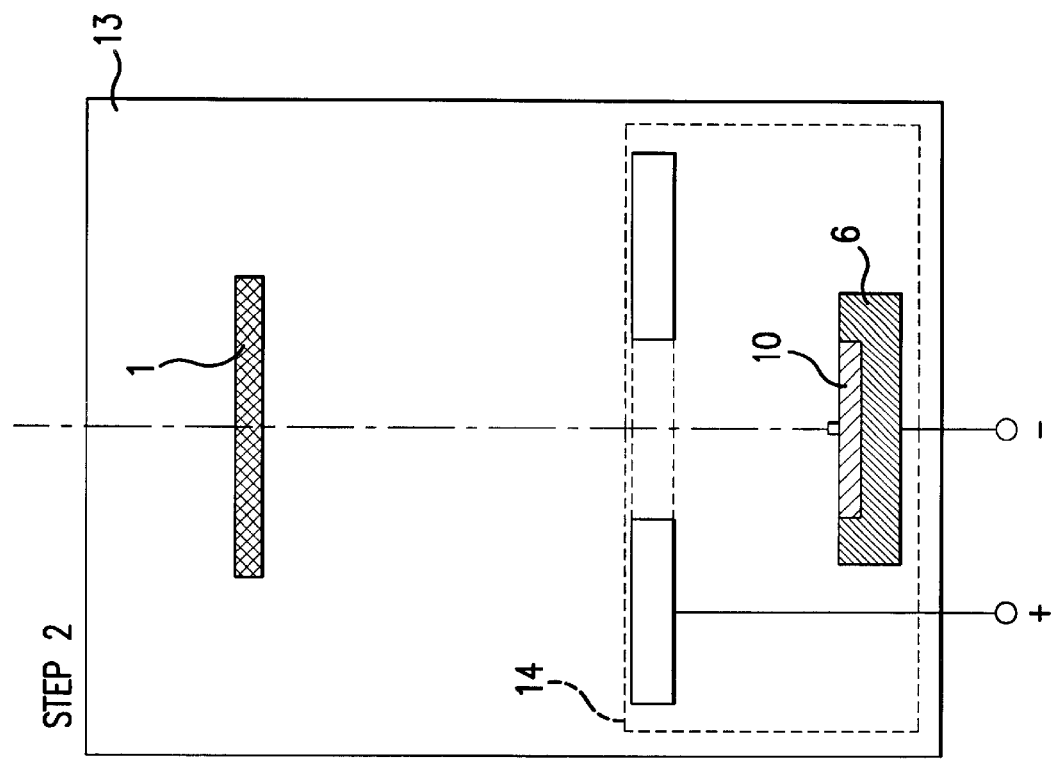
Figure 6:
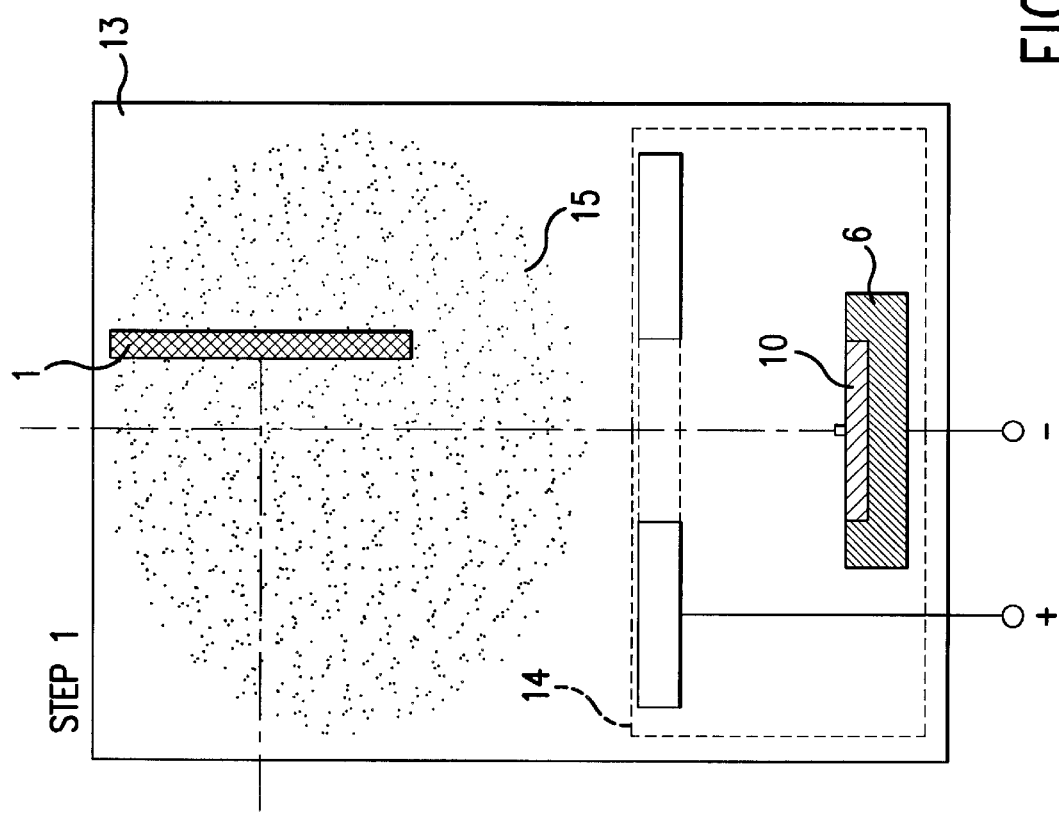

In the example of embodiment 5 thin, conforming barrier coatings are deposited on the walls of trenches or holes, respectively, on previously structured planar, microelectronic substrates with diameters of 20 cm minimum and these indentations are then filled up in a subsequent operation. Both operations are intended to be performed in the same vacuum chamber without intermediate venting. The aspect ratio of these indentations is greater than one. The device according to the invention is shown in the diagram of FIG. 6. For deposition of the barrier coating one substrate 1 each is introduced into the vacuum chamber 13 by the usual specimen manipulators and positioned opposite to the evaporator 14 parallel with the central axis of the evaporator on the substrate support 4. The pulsed vacuum arc evaporator 14 is identical with that one described in example 1. The active zone 10 of the cathode 6 (the so-called target 10) is made of tantalum at the first process step. For coating a gas mixture of argon and nitrogen is let into the vacuum chamber 13 until the operating pressure of 0.5 Pa has been reached. The distance between the evaporator 14 and substrate 1 is, in this case, 50 cm. After the substrate 1 has been located in the coating position by the specimen manipulators, the evaporator 14 is set into operation. In order to coat the side and bottom walls of the 1 $\mu$m deep trenches and holes with a 50 nm thick barrier coating of TaN, 12,500 discharges of the evaporator are released which takes for a pulse frequency of 50 Hz, exactly 4 min and 10 sec. Then the substrate is rotated together with the substrate support by the specimen manipulating device, and the substrate support 4 heated up to 200° C. The tantalum target is pushed out of the active zone 10 of the cathode 6 and a new target 10 made of copper pushed in. After the substrate 1 has been located anew in the coating position by the specimen manipulators, the gas mixture of argon and nitrogen is pumped off and the evaporator 14 set into operation. In order to fill the 1 $\mu$m deep trenches and holes, 25,000 discharges of the evaporator are released which takes for a pulse frequency of 50 Hz, 8 min and 20 sec. Then the substrate is removed from the substrate support by the specimen manipulating device and moved to the next process chamber where undesired coatings are removed by conventional chemical-mechanical polishing.

EXAMPLE OF EMBODIMENT 6

Figure 7:
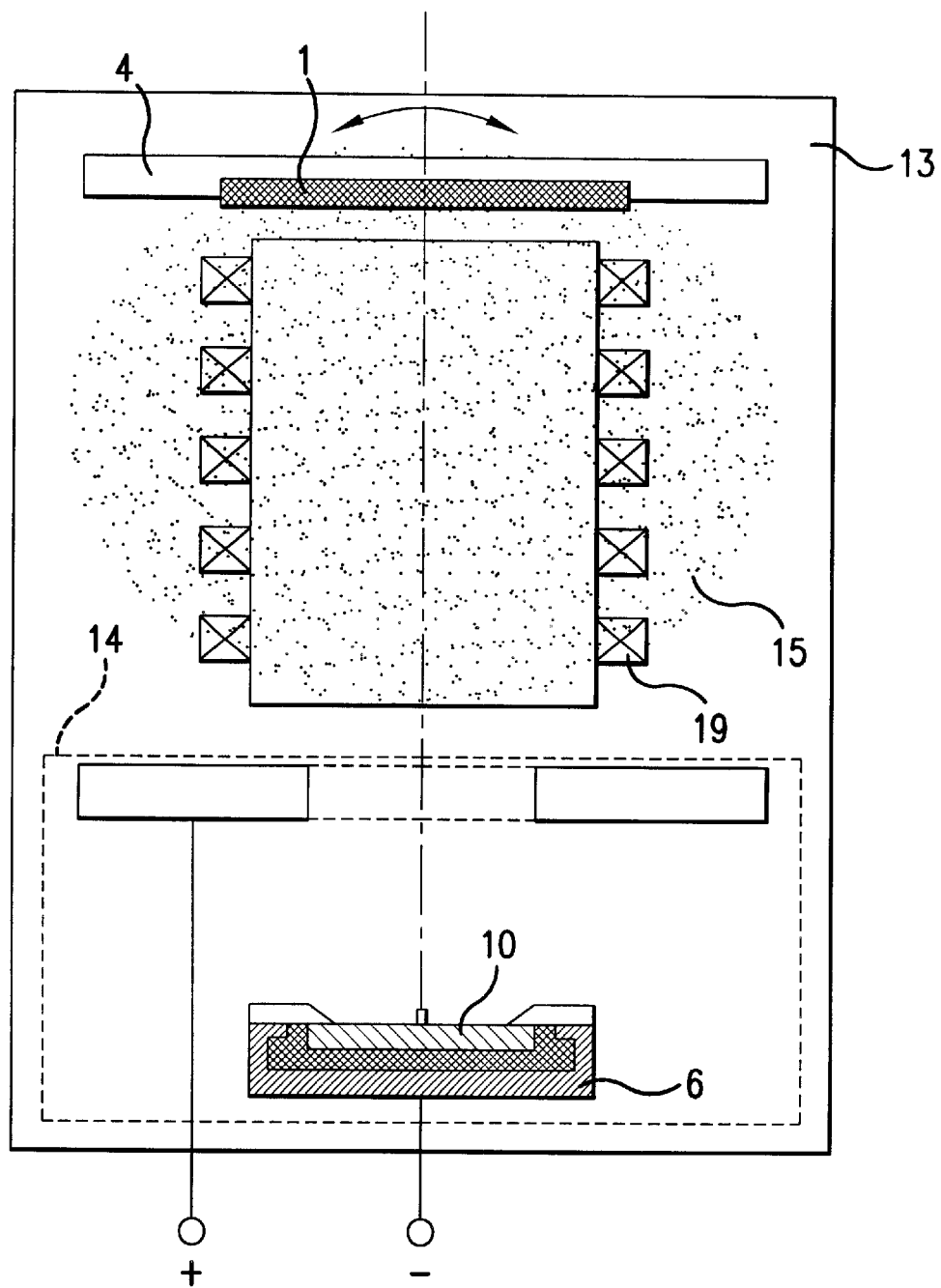

In the example of embodiment 6 thin, conforming barrier coatings are deposited on the walls of trenches or holes, respectively, on previously structured planar, microelectronic substrates with diameters of 20 cm minimum and these indentations are filled up in the next operation. Both operations are performed in the same vacuum chamber without intermediate venting. The aspect ratio of these indentations is greater than one. The deposition rate is intended to be high. At the same time the two coatings are required to contain very few macro particles. The device according to the invention is shown in the diagram of FIG. 7. For deposition of the barrier coating one substrate 1 each is introduced into the vacuum chamber 13 by the usual specimen manipulators and positioned on a rotatable substrate support 4 that is capable of adjusting the substrate 1 opposite to the evaporator 14 parallel with the central axis of the source, or normally to it, respectively. The pulsed vacuum arc evaporator 14 is identical with that one described in example 1. The active zone 10 of the cathode 6 (the so-called target 10) is made of tantalum at the first process step. For coating a gas mixture of argon and nitrogen is let into the vacuum chamber 13 until the operating pressure of 0.5 Pa has been reached. The distance between the evaporator 14 and substrate 1 is, in this case, 100 cm. A coil 19 is arranged between the evaporator 14 and substrate support 4. The central axis of the coil 19 coincides with the central axis of the evaporator 14. The coil 19 consists of a turn of copper tubing (10 mm diameter, 2 mm wall thickness) through which cooling water passes and which is attached via ceramic insulators to the walls of the vacuum chamber 13. The coil 19 has a length of 50 cm, includes 50 turns and is passed by a direct current of 200 A. The inner diameter of the coil 19 is 25 cm. After the substrate 1 has been located in the first coating position (parallel with the central axis of the evaporator) by the specimen manipulators, the evaporator 14 is set into operation. In order to coat the side and bottom walls of the 1 $\mu$m deep trenches and holes with a 50 nm thick barrier coating of TaN, 7,500 discharges of the evaporator are released which takes for a pulse frequency of 50 Hz, 2 min and 30 sec. Then the substrate is rotated together with the substrate support by the specimen manipulating device, and the substrate support 4 heated up to 200° C. The tantalum target is pushed out of the active zone 10 of the cathode 6 and a new target 10 made of copper pushed in. Then the substrate 1 is located anew in the coating position by the specimen manipulators so that the central axes of the substrate 1 and evaporator 14 coincide. After the gas mixture of argon and nitrogen has been pumped off, the evaporator 14 is set into operation. In order to fill the 1 $\mu$m deep trenches and holes, 15,000 discharges of the evaporator 14 are released. This takes for a pulse frequency of 50 Hz, 5 min. Then the substrate is removed from the substrate supports by the specimen manipulating device and moved to the next process chamber where undesired coatings are removed by conventional chemical-mechanical polishing.

EXAMPLE OF EMBODIMENT 7

Figure 8:
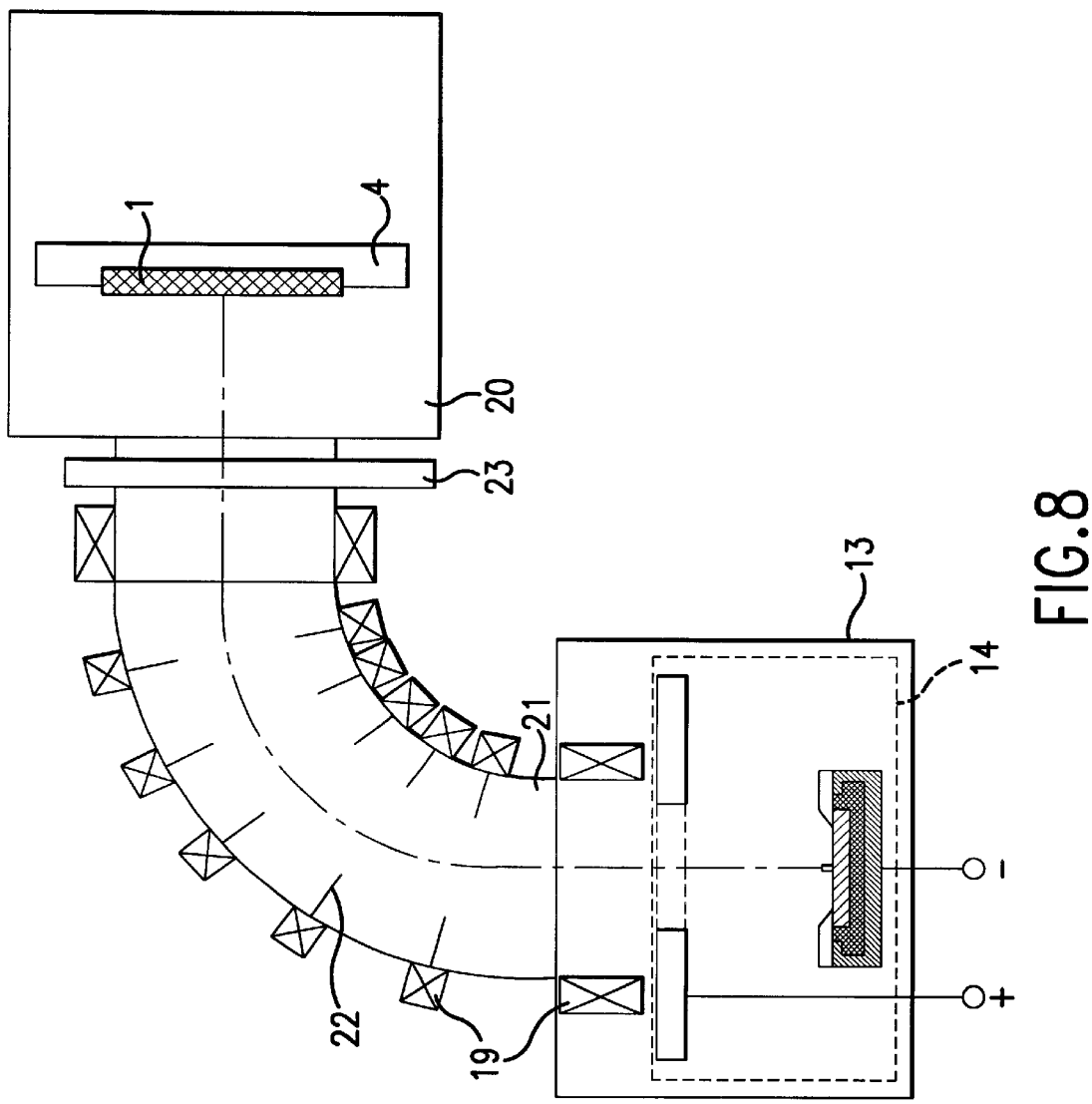

In the example of embodiment 7 trenches or holes, respectively, on previously structured planar, microelectronic substrates with diameters of 20 cm minimum are filled with copper. The aspect ratio of these indentations is greater than one. In particular, the depositions have to be performed such that no macro particles are deposited on the substrate 1 and no such particles can enter the coating chamber. The device according to the invention is shown in the diagram of FIG. 8. A vacuum chamber 13 in which an evaporator 14 is arranged, as described in the example of embodiment 1, is connected with the coating recipient 20 through a tubeshaped, semicircular curved intermediate recipient 21 the inner diameter of which is 20 cm and the total radius of curvature of which is 60 cm. Seven coils 19 with 3000 turns each are coaxially arranged around the intermediate recipient 21. The interior of the tube recipient is covered with washers 22 that retain macro particles emitted by the evaporator 14. To ensure the possibility of periodic cleaning of the evaporating and intermediate recipient without affecting the vacuum in the coating recipient 20, the components can be isolated by a plate valve 23. To deposit the coating one substrate 1 each is introduced into the coating recipient 20 by the usual specimen manipulators and positioned opposite to the entry opening normal to the central axis of this opening in the coating position on the substrate support 4. The distance between the entry opening and the substrate 1 is, in this case, 30 cm. After the substrate 1 has been located in the coating position by the specimen manipulators, the evaporator 14 is set into operation. In order to fill the 1 $\mu$m deep trenches and holes, 75,000 discharges of the evaporator 14 are released which takes for a pulse frequency of 200 Hz, 6 min and 15 sec. Then the substrate is removed from the substrate support by the specimen manipulating device and moved to the next process chamber.

Nomenclature
1 Substrate
2 Barrier coating
3 Strip conductor material
4 Substrate support
5 Anode
6 Cathode
7 Ignitor
8 Pulsed current source
9 Process control electronics
10 Target
11 Clamping device
12 Target slide
13 Vacuum chamber
14 Pulsed vacuum arc evaporator
15 Plasma
16 Adjustable entry opening
17 Adjustable entry opening
18 Aperture
19 Coil
20 Coating recipient
21 Intermediate recipient
22 Washer
23 Plate valve

What is claimed is:

1. A process for metallization of semiconductor structures by vapor phase deposition wherein deposition occurs in trenches and holes in a substrate material, the process comprising the steps of:
    providing pulsed vacuum arc evaporator;
    first depositing a barrier coating on a surface of the trenches and holes using a first plasma generated by the pulsed vacuum arc evaporator; and
    second depositing a conductor material on the barrier coating using a second plasma generated by the pulsed vacuum arc evaporator to fill the trenches and holes with the conductor material.

2. The process according to claim 1 wherein the deposition of the barrier coating is conducted in a low-pressure gas.

3. The process according to claim 2 wherein an inert gas is used as the gas.

4. The process according to claim 2 wherein a reactive gas is used as the gas.

5. The process according to claim 1, 2, 3, or 4, wherein the pulsed vacuum arc evaporator includes:
    a vacuum chamber containing an anode, a cathode, and an ignitor;
    a pulsed current source connected to the cathode and the anode; and
    process control electronics for controlling the pulsed current source to generate the first plasma and the second plasma such that the substrate is exposed to the first plasma and second plasma that is emitted from one of the cathode and the anode.

6. The process according to claim 5 wherein the pulsed vacuum arc evaporator is operated with current pulses whose amplitudes are higher than 500 Amperes.

7. The process according to claim 5 wherein at least one of the depositing steps include aligning a central axis of the vacuum evaporator to aim at the substrate.

8. The process according to claim 7 wherein a whole surface of the substrate is covered against the vacuum evaporator by an aperture between the pulsed vacuum arc evaporator and the substrate.

9. The process according to claim 8 wherein the substrate and the aperture are operated electrically insulated from each other.

10. The process according to claim 8 wherein potentials at at least one of the substrate and the aperture in relation to the cathode is adjustable.

11. The process according to claim 5 wherein at least one of the depositing steps includes aligning a central axis of the substrate to aim at the pulsed vacuum arc evaporator.

12. The process according to claim 5 wherein said second depositing step includes simultaneous metallization of several substrates and a central axis of each of the substrates is adjusted to aim at a center of the pulsed vacuum arc evaporator.

13. The process according to claim 5 wherein said second depositing for effecting metallization includes feeding a low-pressure inert gas to the plasma in the vacuum chamber and to the substrate.

14. The process according to claim 5 wherein during said second depositing step for effecting metallization, the substrate has an axis normal to a surface thereof at a right angle to a central axis of the pulsed vacuum arc evaporator.

15. The process according to claim 14 wherein during said second depositing step for effecting metallization, the substrate is rotated around a central axis of the substrate.

16. The process according to claim 5 wherein said second depositing for effecting metallization includes feeding a low-pressure reactive gas to the plasma in the vacuum chamber and to the substrate.

17. The process according to claim 1, 2, 3, or 4, wherein said second depositing step for effecting metallization occurs through a current-carrying coil disposed between the pulsed vacuum arc evaporator and the substrate and an inner diameter of the coil is greater than or equal to a substrate diameter of the substrate.

18. The process according to claim 17 wherein an intermediate recipient is used whereby the coils are outside of the intermediate recipient.

19. The process according to claim 1, 2, 3, or 4, wherein said second depositing step for effecting metallization occurs through a curved current-carrying coil disposed between the pulsed vacuum arc evaporator and the substrate and central axes of the pulsed vacuum arc evaporator and the substrate are aimed at a center of a corresponding coil opening of the curved current-carrying coil.

20. The process according to claim 1, 2, 3, or 4, wherein said second depositing step for effecting metallization occurs through several current-carrying coils arranged in an arc between the pulsed vacuum arc evaporator and the substrate and central axes of the pulsed vacuum arc evaporator and the substrate are aimed at a center of a respective on of the coils opposite thereto.

21. The process according to claim 1, 2, 3, or 4, wherein the substrate is insulated from the cathode.

22. The process according to claim 1, 2, 3, or 4, wherein the substrate is set at a certain potential relative to the cathode.

* * * * *